(12) United States Patent
Leong et al.

(10) Patent No.: US 7,833,900 B2
(45) Date of Patent: Nov. 16, 2010

(54) INTERCONNECTIONS FOR INTEGRATED CIRCUITS INCLUDING REDUCING AN OVERBURDEN AND ANNEALING

(75) Inventors: Lup San Leong, Singapore (SG); Yong Kong Siew, Sungai Pelek (MY); Liang Choo Hsia, Singapore (SG)

(73) Assignee: Chartered Semiconductor Manufacturing, Ltd., Singapore (SG)

(*) Notice: Subject to any disclaimer, the term of this patent is extended or adjusted under 35 U.S.C. 154(b) by 0 days.

(21) Appl. No.: 12/048,223

(22) Filed: Mar. 14, 2008

(65) Prior Publication Data
US 2009/0233441 A1    Sep. 17, 2009

(51) Int. Cl.
*H01L 21/4763* (2006.01)
*H01L 21/44* (2006.01)
*H01L 21/302* (2006.01)

(52) U.S. Cl. .................. 438/635; 438/675; 438/687; 438/691

(58) Field of Classification Search .................. 438/638, 438/675, 687, 691; 257/E21.579
See application file for complete search history.

(56) References Cited

U.S. PATENT DOCUMENTS

| | | | |
|---|---|---|---|
| 6,495,200 B1 * | 12/2002 | Chan et al. | 438/626 |
| 6,500,754 B1 | 12/2002 | Erb et al. | |
| 7,314,827 B2 * | 1/2008 | Toyoda et al. | 438/637 |
| 2005/0106848 A1 * | 5/2005 | Bailey et al. | 438/597 |

OTHER PUBLICATIONS

E.T. Ogawa et al., Stress-Induced Voiding Under Vias Connected to Wide Cu Metal Leads, 40th Annual International Reliability Physics Symposium, 2002, 312-321, IEEE 02CH37320, Dallas, Texas.

T. Harada et al., Reliability Improvement of Cu Interconnects by Additional Anneal between Cu CMP and Barrier CMP, Interconnect Technology Conference, 2003, Jun. 2-4, 2003, 92-94, Proceedings of the IEEE 2003 International.

A. H. Fischer et al., Process Optimization—The Key to Obtain Highly Reliable Cu Interconnects, Interconnect Technology Conference, 2003, Jun. 2-4, 2003, 253-255, Proceedings of the IEEE 2003 International.

* cited by examiner

*Primary Examiner*—William M. Brewster
(74) *Attorney, Agent, or Firm*—Horizon IP Pte Ltd (57) ABSTRACT

The present invention discloses a method of manufacturing an integrated circuit on a semiconductor substrate having a semiconductor device provided thereon, including the steps of forming a copper layer having an overburden of a desired thickness, forming a layer of inert metal on the copper layer, annealing the copper layer and removing the layer of inert metal.

37 Claims, 11 Drawing Sheets

Prior Art

INTERCONNECTIONS FOR INTEGRATED CIRCUITS INCLUDING REDUCING AN OVERBURDEN AND ANNEALING

FIELD OF THE INVENTION

The present invention relates generally to the integrated circuits and more particularly to interconnections in integrated circuits.

BACKGROUND OF THE INVENTION

The fabrication of integrated circuits (ICs) involves the formation of features on a substrate that make up circuit components, such as transistors, resistors and capacitors. The circuit components are interconnected, enabling the ICs to perform the desired functions.

Figure 1:
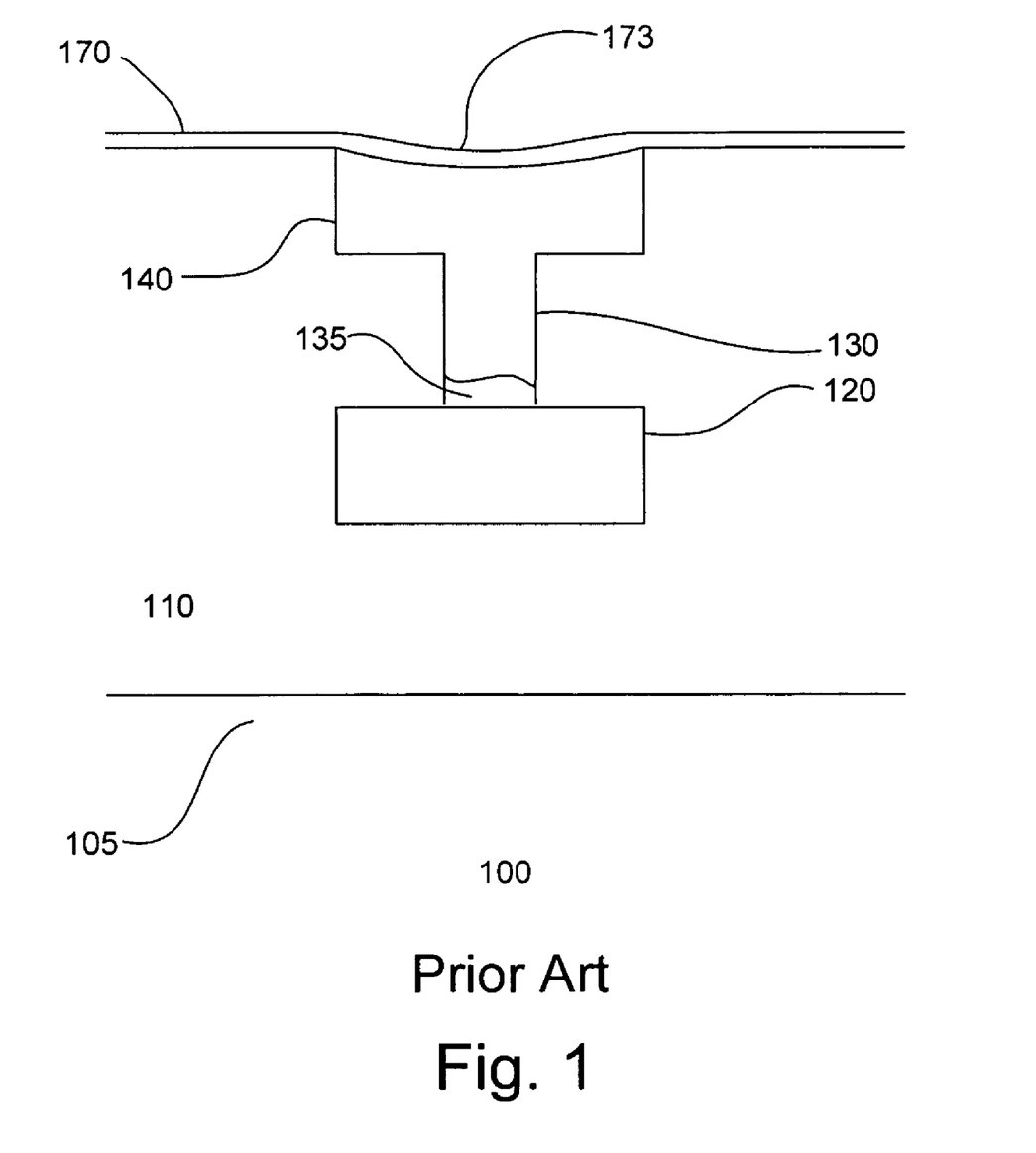
FIG. 1 shows a conventional interconnection for ICs.

FIG. 1 shows an interconnection used in ICs 100. The interconnection is formed in an interlevel dielectric (ILD) layer 110 disposed on a substrate 105. A copper line 140 is disposed on an upper part of the ILD layer. Coupled to the metal line is a contact 130, interconnecting the metal line to the substrate below. The contact can be coupled to another copper line or device feature 120. Typically, an IC includes a plurality of metal levels.

To form the interconnection, the ILD layer is patterned to create a via and trench. The via and trench are filled with copper. The copper includes an overburden to ensure filling of the trench and via. The overburden or excess copper is then removed by chemical mechanical polishing (CMP) to form a planar top surface with the metal line 170 and ILD layer. In conventional interconnection processes, a pre-CMP low temperature anneal, for example, less than 150° C. is performed on the copper.

However, conventional interconnection processes induces tensile stress 173 on the metal line which can cause a void 135 ("via pull-out") between the contact and, for example, metal line below. This can cause contact failure in the IC.

From the foregoing discussion, it is desirable to provide interconnections without void in the contacts.

SUMMARY OF THE INVENTION

The present invention relates to integrated circuits, more particularly to interconnections without voids in contacts. In one aspect of the invention, a process for forming an IC is disclosed. The process comprises providing a substrate prepared with a dielectric layer with a trench which corresponds to a conductive line. A conductive layer is deposited on the substrate to fill the trench, wherein the conductive layer includes an overburden to ensure filling of the trench. The process further comprises reducing partially a thickness of the overburden and annealing the substrate with the partially reduced overburden.

A process for polishing a conductive material in an IC is disclosed in another aspect of the invention. The process comprises providing a substrate prepared with a dielectric layer with a trench which corresponds to a conductive line. A conductive layer is deposited on the substrate to fill the trench, wherein the conductive layer includes an overburden to ensure filling of the trench. The process further comprises reducing partially a thickness of the overburden and forming a passivation layer on the partially reduced overburden. The substrate with the partially reduced overburden and passivation layer is annealed. The passivation layer is removed. The process further includes the step of reducing the partially reduced overburden, barrier layer and hard mask to form a top planar surface with the dielectric layer and conductive material of the conductive layer in the trench.

In yet another aspect of the invention, a tool configuration for forming conductive lines is presented. The tool comprises a first tool platform. The first tool platform includes a polishing module to partially removing bulk conductive material and a deposition module for forming a passivation layer on the partially removed bulk conductive material. The tool configuration further includes a second tool platform which comprises a polishing module with first, second and third platens.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the present invention are described with reference to the following drawings, in which.

DETAILED DESCRIPTION OF THE INVENTION

The present invention relates to forming interconnections in IC. More particularly, the present invention relates to forming interconnections in ICs without voids in contacts. The invention can be applied to both single or dual damascene processes for forming interconnections.

Figure 2:
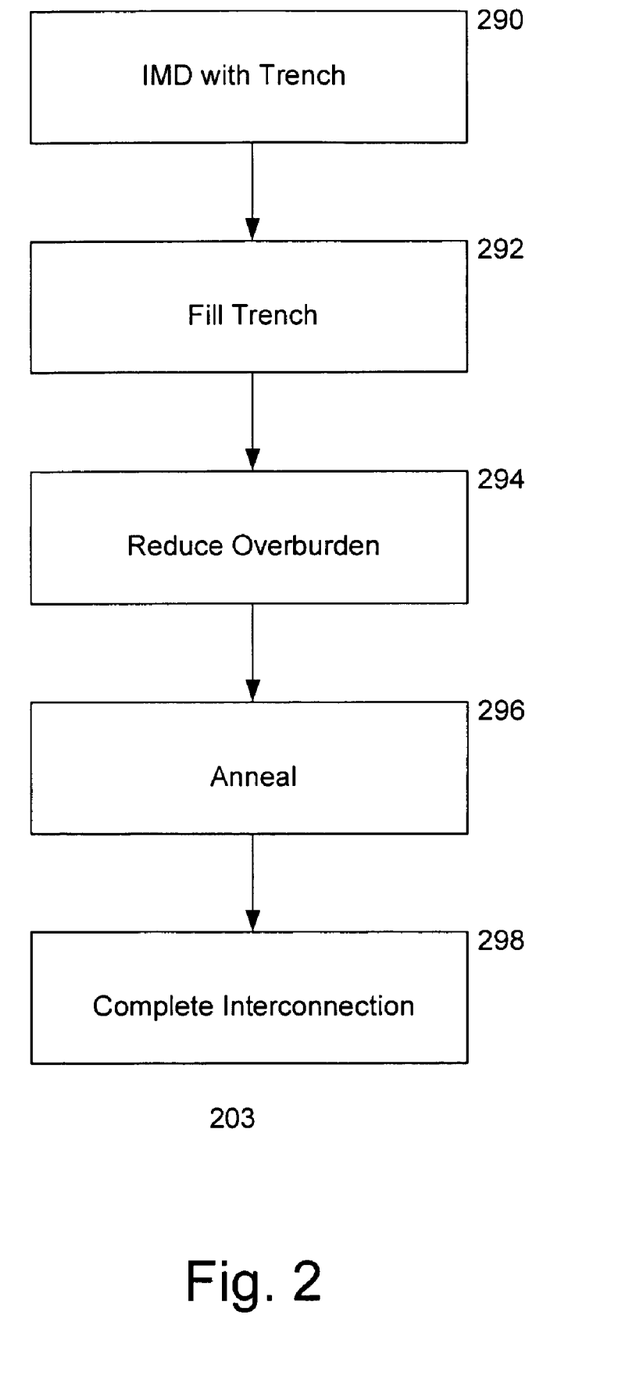
FIG. 2 shows a process flow of forming interconnections in ICs in accordance with one embodiment of the invention.

FIG. 2 shows a process flow 203 of forming interconnections in accordance with one embodiment of the invention. The process commences at step 290 by providing a substrate prepared with a patterned intermetal dielectric (IMD) layer over a substrate. The IMD can represent any metal layer of an IC with trenches corresponding to metal lines. Typically, a barrier layer lines the trenches and the IMD surface.

At step 292, a conductive material is deposited on the substrate to fill the trenches (and vias if applicable). The conductive material, for example, comprises copper formed by electroplating. Other materials or deposition techniques are also useful. To ensure that the trenches are filled, the conductive material includes an overburden. The thickness of the overburden is reduced by, for example, CMP at step 294.

After partial removal of the overburden, the substrate is annealed at step 296 to induce copper re-crystallization and grain growth. The anneal, for example, is performed at a temperature of about 150-500° C. Annealing the substrate at a high temperature reduces defects in the interconnects and tensile stresses.

We have discovered that by annealing a thinner copper layer, via pull out is reduced or prevented. In one embodiment, the thickness of the overburden is reduced sufficiently to reduce or prevent via pull out during subsequent high temperature processes, such as the annealing process at step 296. Typically, the thickness of the overburden remaining is about of 500-3000 Å. Other thicknesses of the overburden remaining may also be useful and may depend on, for example, process and design parameters.

In a preferred embodiment, prior to annealing the substrate, a passivation layer is formed over the reduced copper overburden. The passivation layer reduces or protects the copper layer against corrosion, for example, during the annealing process at step 296. In one embodiment, the passivation layer comprises an inert material. Preferably, the passivation layer comprises an inert metal. Various types of inert metal or alloy thereof can be employed. For example, the passivation layer can be formed from Palladium (Pd), Platinum (Pt), Cobalt Tungsten (CoW) or a combination thereof. Other types of materials, such as non-metal inert materials or non-inert materials are also useful. The passivation layer is removed after the annealing process at step 296.

The process continues to complete the formation of the interconnects at step 298. In one embodiment, the remaining overburden is removed by CMP to produce a planar surface with the copper lines and IMD layer. Step 298 can include multiple CMP steps. The number of steps can depend on the interconnection design. For example, an interconnection design can include a hard mask on the surface of the IMD layer and a barrier layer lining trench sidewalls and the hard mask. Three CMP steps can be employed for such interconnection designs. For example, a first CMP step removes the remaining overburden up to the barrier layer, a second CMP step removes the barrier layer to expose the hard mask, and a third CMP step removes the hard mask. Other processing schemes are also useful.

Figure 3A:
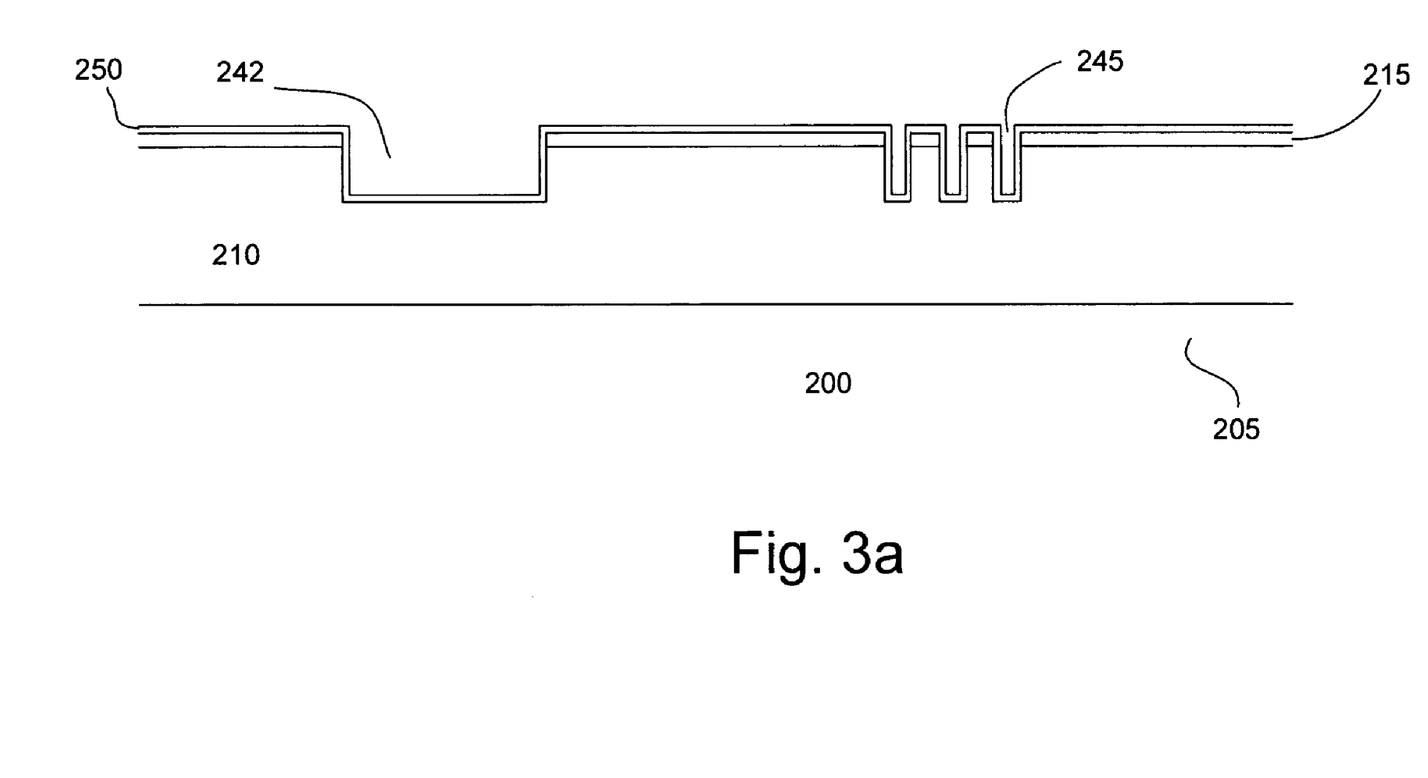
FIGS. 3a-g show a process for forming interconnections in accordance with one embodiment of the invention.

FIGS. 3*a-g* show cross-sectional views of a process of forming interconnections for an IC 200 in accordance with one embodiment of the invention. Referring to FIG. 3*a*, a substrate 205 is provided. The substrate, for example, comprises silicon substrate. Other types of substrates, such as silicon on insulator and silicon-germanium, are also useful. The substrate has been processed to include circuit components (not shown) and an intermetal dielectric (IMD) layer 210. In one embodiment, the IMD layer comprises silicon oxide. Other types of dielectric materials, such as low k or ultra low k, are also useful. The IMD layer can be any metal level of the IC. The IMD is patterned to include trenches corresponding to metal lines of the metal layer. A hard mask 215 can be used to pattern the IMD layer. The hard mask layer can comprise, for example, silicon nitride, silicon dioxide, carbon-doped silicon oxide (SiOC) or a metal, such as TiN. Other hard mask materials are also useful. In dual damascene applications, vias are provided in communication with the trenches. In single damascene applications, contacts are provided in communication with the trenches.

Typically, the IMD layer includes wide trenches and narrow nested trenches 242 and 245. A barrier layer 250 lines the trenches and surface of the IMD. The barrier layer, for example, can be formed from a conductive material, such as tantalum nitride or titanium nitride. Other types of barrier materials are also useful.

Figure 3B:
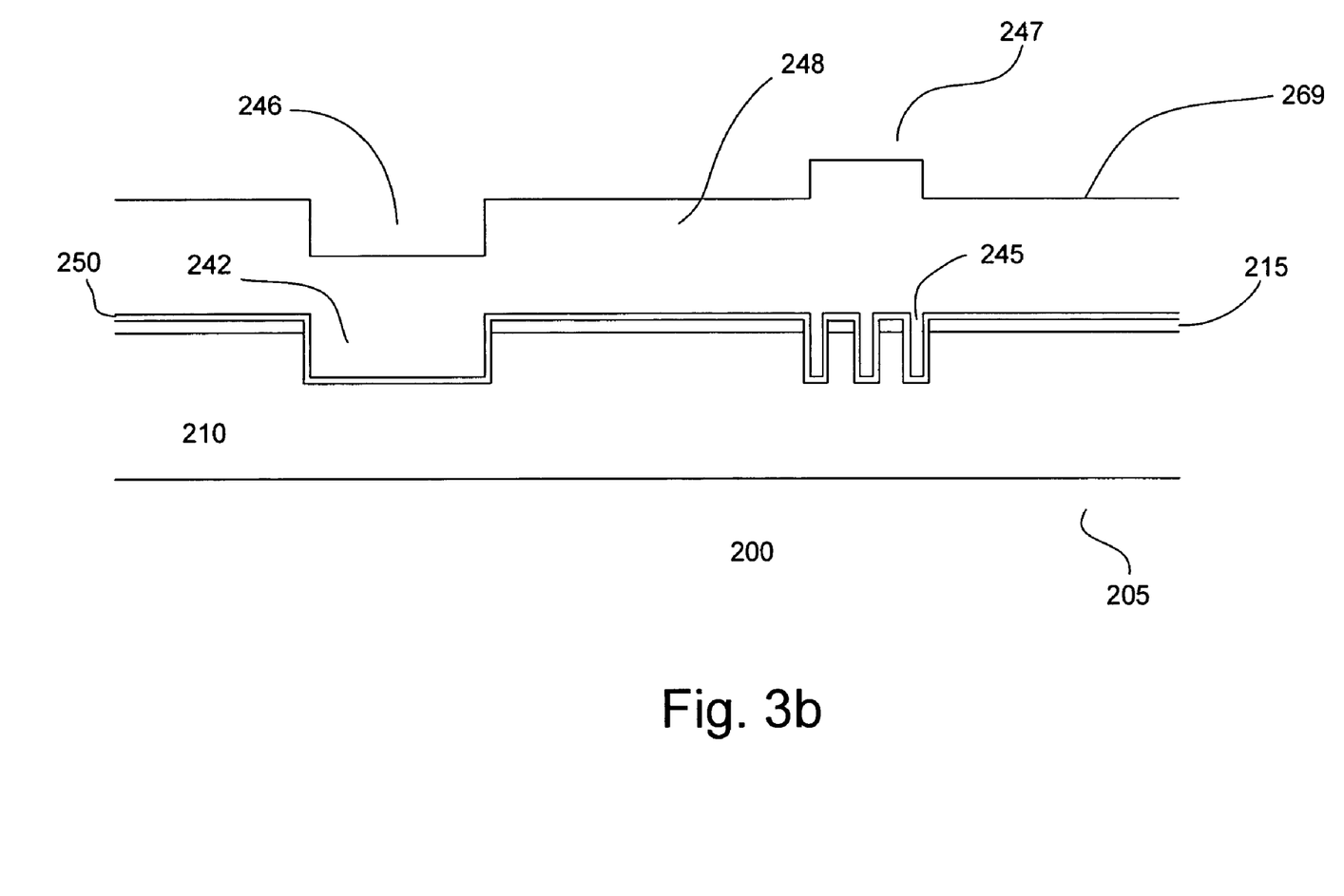

As shown in FIG. 3*b*, a conductive layer 248 is deposited on the substrate. The conductive layer fills the trenches and covers the barrier layer on the surface of the IMD layer. In one embodiment, the conductive layer comprises copper deposited by, for example, electroplating. Other materials or deposition techniques are also useful. To ensure filling the trenches, a conductive layer includes an overburden 269. The overburden typically can be about two to five times the depth of the trenches. For example, the overburden thickness for a trench depth of 0.5 μm can be about 1.0-2.5 μm. The fill process is generally conformal fill for wide trenches and super fill for narrow nested trenches. This results in a trough 246 over the wide trench and a bump 247 over the narrow nested trenches.

Figure 3C:
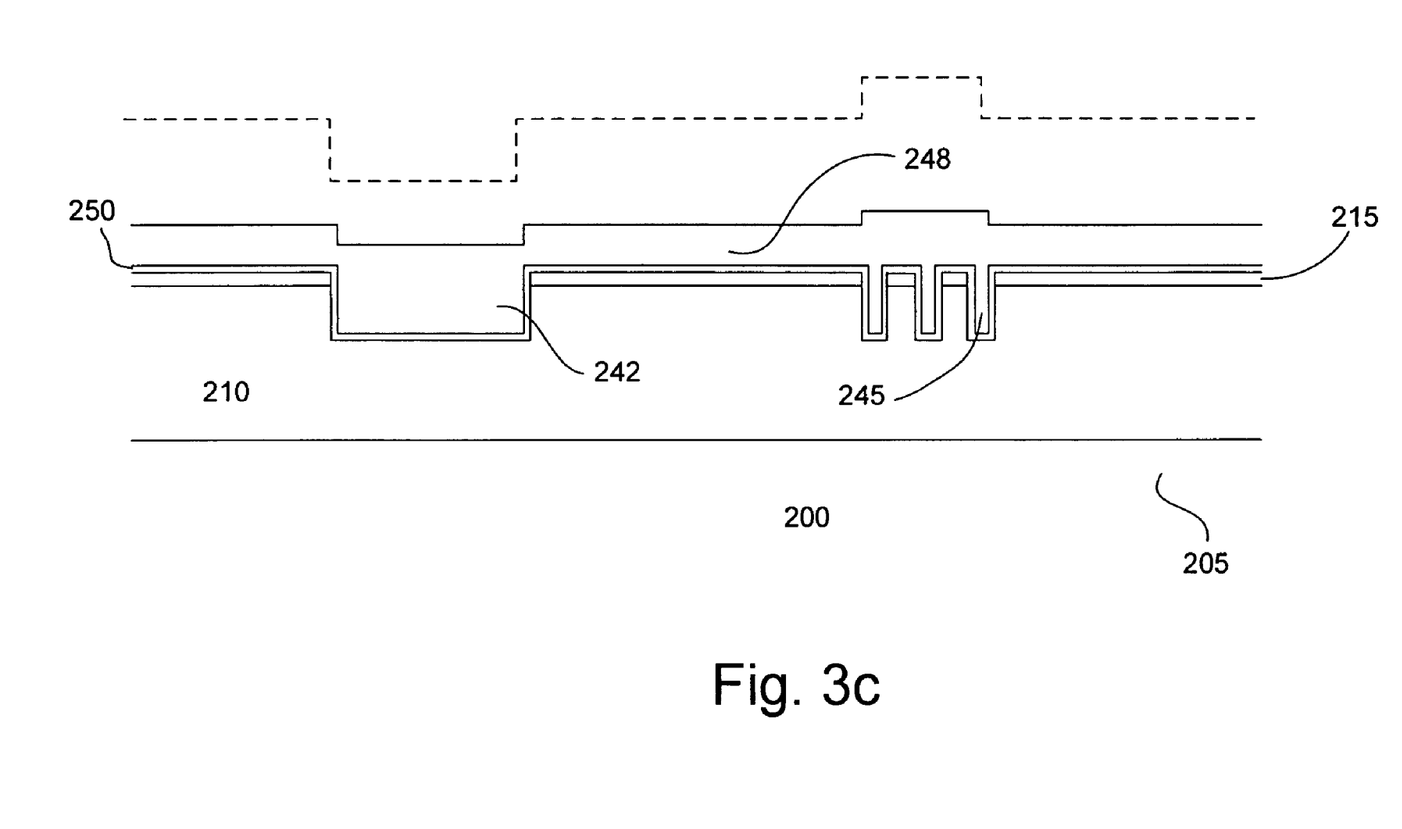

Referring to FIG. 3*c*, the thickness of the overburden is reduced. In accordance with one embodiment of the invention, the overburden is reduced directly after the conductive layer is deposited. The overburden can be reduced by CMP. Preferably, the overburden is removed by electro-CMP (eCMP). Other techniques for reducing the overburden, for example, reactive ion etching (RIE), are also useful.

After partial removal of the overburden, the substrate is annealed. In one embodiment, the substrate is annealed at sufficient temperature to induce copper re-crystallization and grain growth. For example, the substrate is annealed at a temperature of about 150-500° C. Preferably, the substrate is annealed at a temperature of about 200-450° C. and more preferably about 200-400° C. Annealing the substrate at high temperatures reduces defects in the interconnects and tensile stresses.

Furthermore, annealing a thinner copper layer reduces or prevents via pull out. In one embodiment, the thickness of the overburden is reduced sufficiently to reduce or prevent via pull out during the anneal and other high temperature processes. Typically, the thickness of the overburden remaining is about of 500-3000 Å. Other thicknesses of the remaining overburden may also be useful and may depend on, for example, process and design parameters.

Figure 3D:
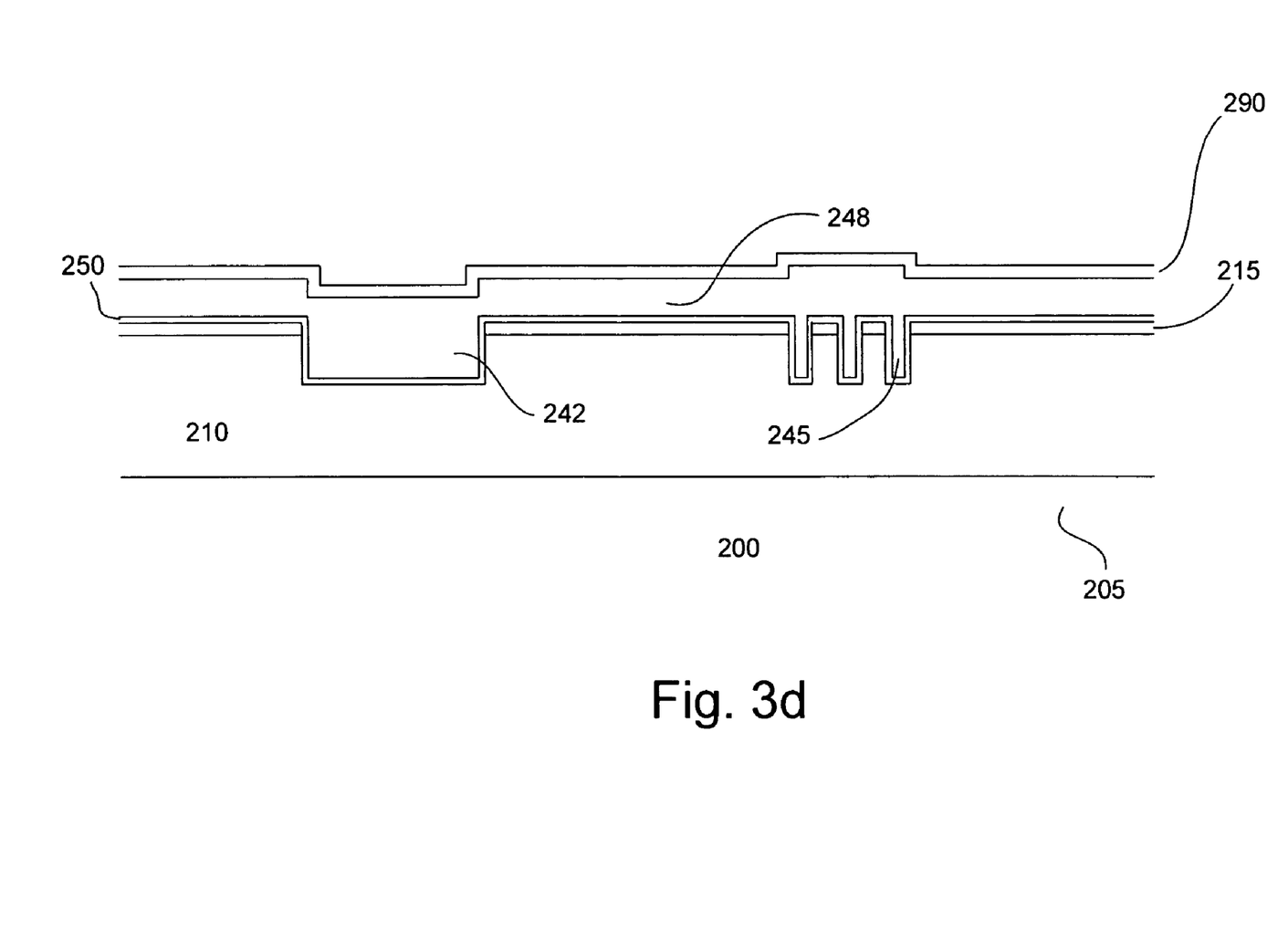

In one embodiment, a passivation layer 290 is deposited on the overburden prior to annealing the substrate, as shown in FIG. 3*d*. The buffer layer protects the copper from corrosion or oxidation. Providing a passivation layer also advantageously improves the surface uniformity of the topography prior to the annealing process.

The passivation layer, in one embodiment, comprises an inert material. Preferably, the passivation layer comprises an inert metal. Various types of inert metal or alloy thereof can be employed. For example, the passivation layer can be formed from Palladium (Pd), Platinum (Pt), Cobalt Tungsten (CoW) or a combination thereof. Other types of materials, such as non-metal inert materials or non-inert materials are also useful.

To prepare for deposition of the passivation layer, the substrate is cleaned. Typically, a wet clean process is performed. In one embodiment, the passivation layer is deposited by electroless plating or physical vapor deposition (PVD). Preferably, the passivation layer is deposited in-situ. Forming the passivation by electroless plating or PVD advantageously avoids additional cleaning steps after deposition, thus reducing processing time. Other depositing techniques are also useful. The thickness of the passivation layer, for example, is about 20-150 Å. Other thicknesses may also be useful.

Figure 3E:
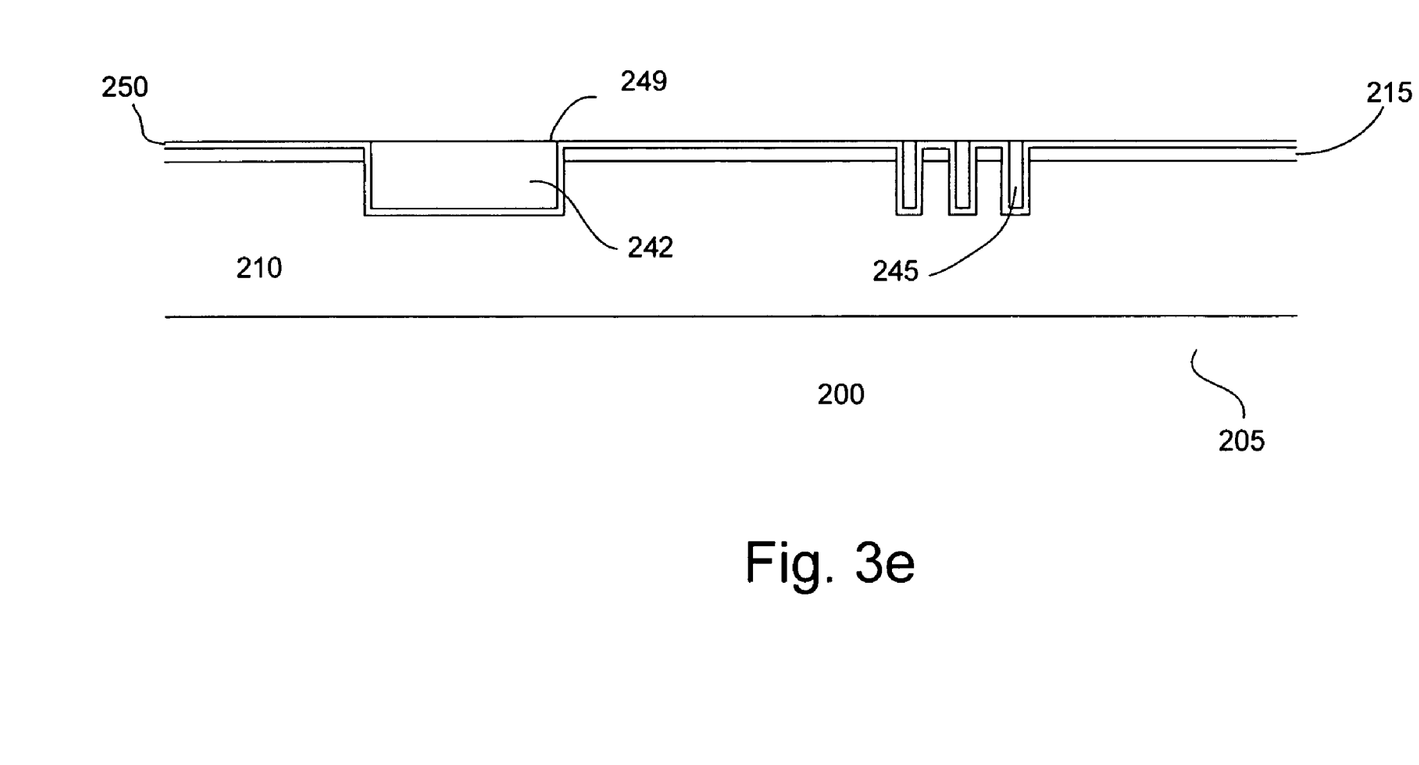

After annealing, the passivation layer and remaining overburden are removed by CMP, as shown in FIG. 3*e*. Preferably, the CMP comprises eCMP. A planar top surface 249 between the copper and barrier layer is produced. In one embodiment, the passivation layer and overburden are removed using a slurry having high selectivity to the overburden material. By using a slurry which has a high selectivity to copper, improved planarity is achieved. For example, the copper over the raised or bump region is exposed before the copper in the trough region. As a result, the copper in the bump region is removed first before the copper in the trough region is exposed. Finally when the passivation layer is completely removed, the copper topology is more uniform due to the fact that the higher regions are already removed.

Alternatively, a slurry which has a low selectivity to the overburden material can be used. The polish rate of the slurry for the passivation layer, for example, should be about 2 to 3 times higher than the polish rate for the Cu layer. This minimizes the removal of the remaining Cu layer.

Figure 3F:
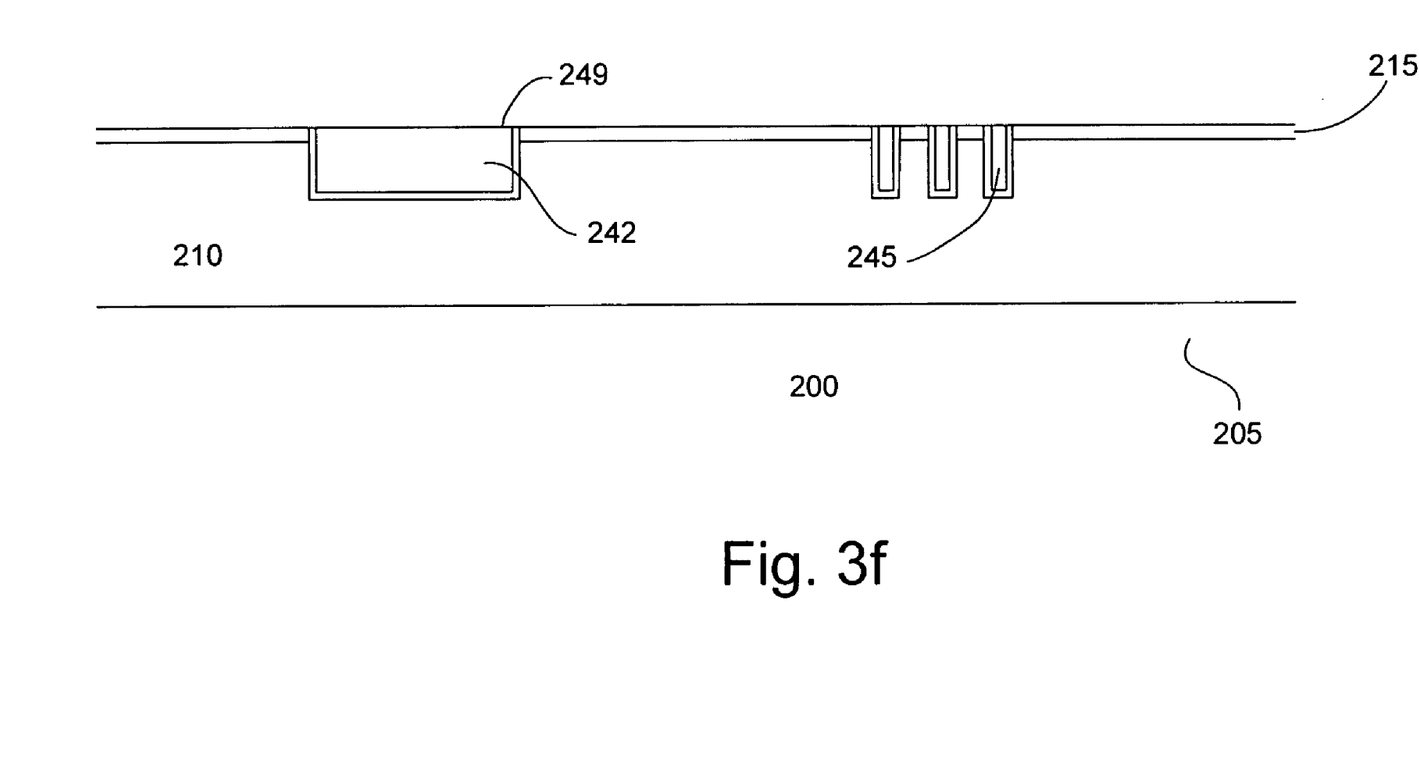
Figure 3G:
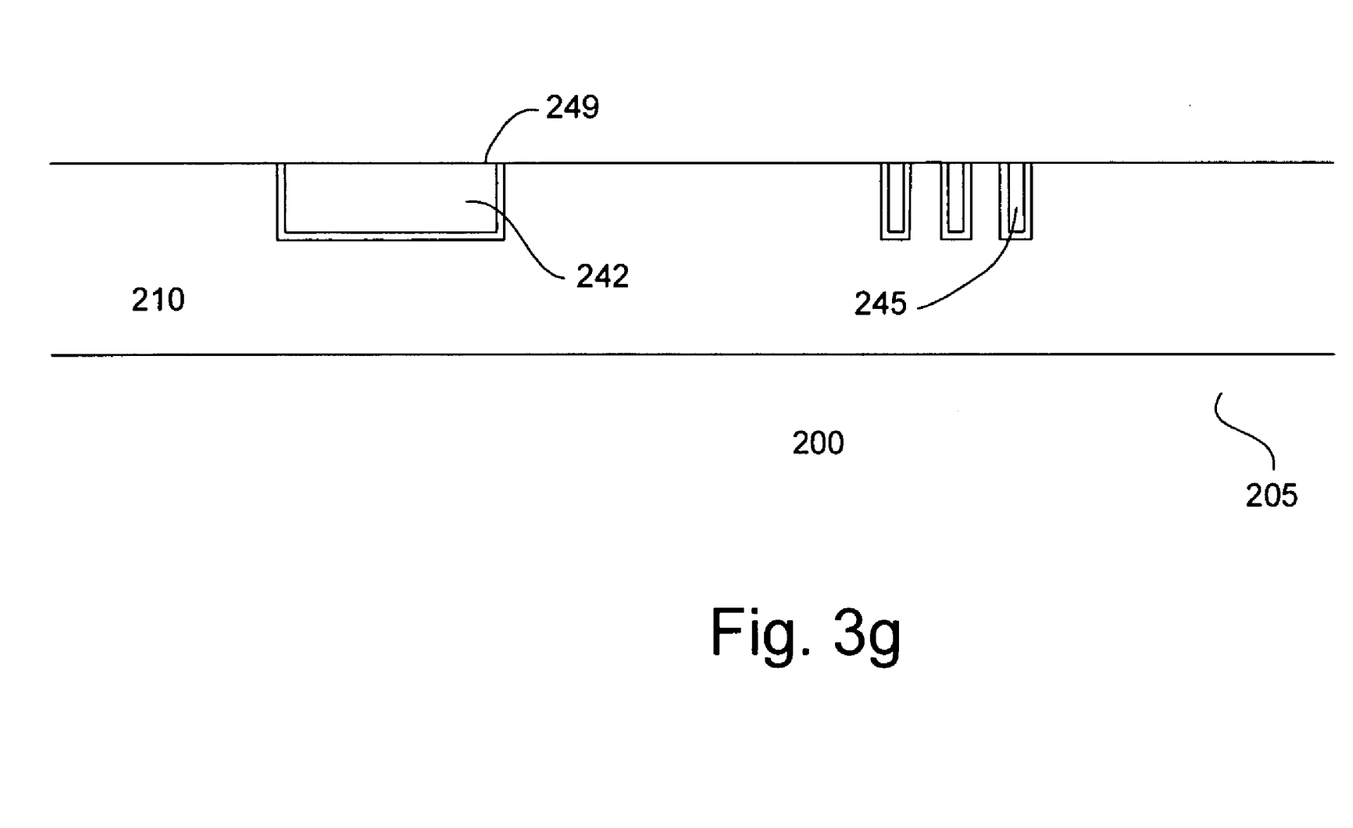

Referring to FIGS. 3f-g, the substrate surface is polished to remove the barrier layer, hard mask and portions of the copper in trenches to produce a planar top surface. The polishing, for example, comprises CMP. Preferably, the polishing comprises eCMP. The polishing to remove the barrier and hard mask can be performed in different CMP processes. The process can continue to form the IC. For example, the process can include forming additional metal layers, passivation, and packaging.

Figure 4:
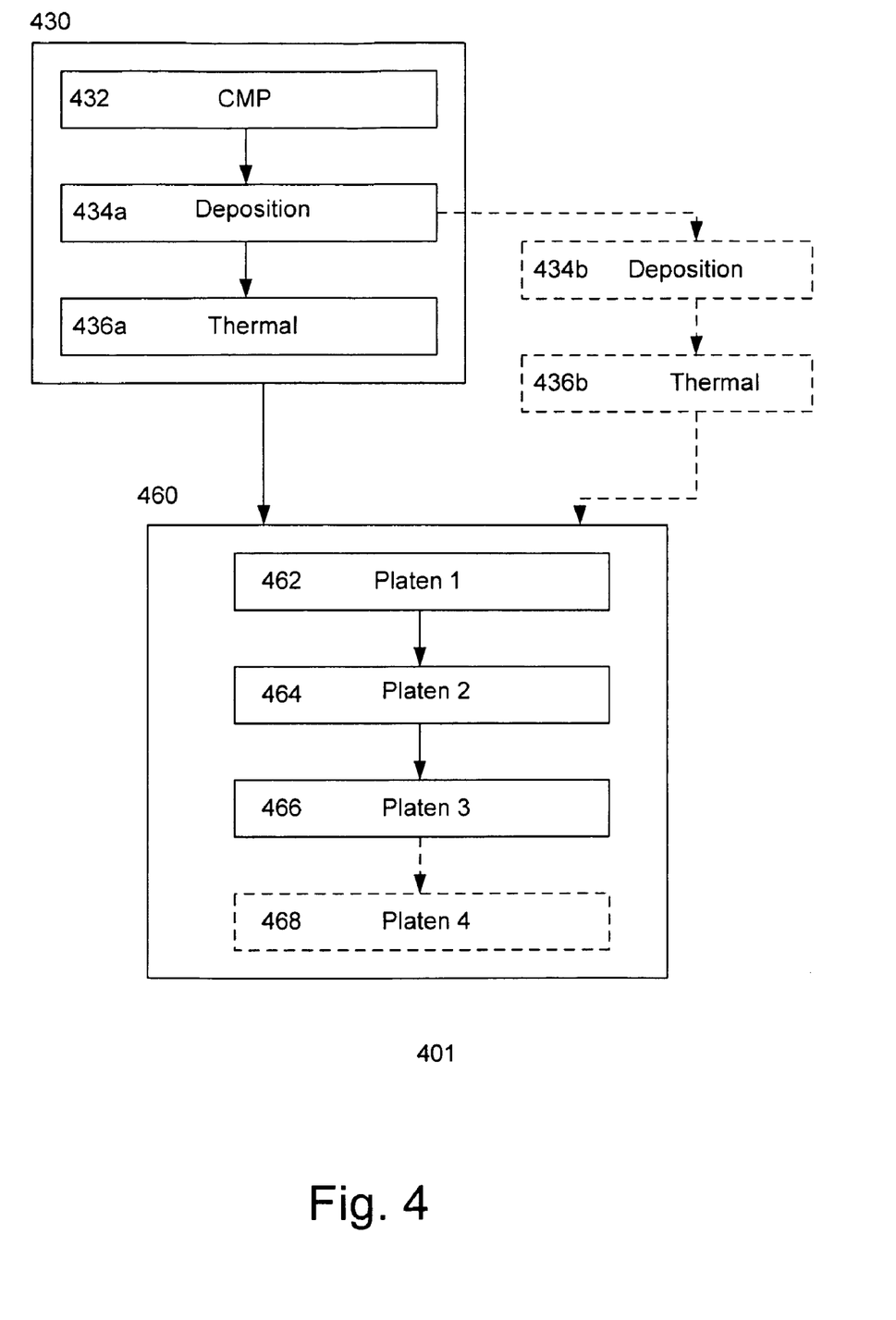
FIG. 4 shows a tool configuration for forming interconnections in accordance with another embodiment of the invention.

FIG. 4 shows a tool configuration 401 for processing interconnects in accordance with one embodiment of the invention. The tool configuration includes first and second tool platforms 430 and 460. The first tool platform comprises a high throughput tool which performs bulk removal of copper to reduce the overburden and the second tool platform comprises a polishing tool for completing the formation of the metal layer after partial removal of the overburden by the first tool platform.

The first tool platform comprises a removal module 432. In one embodiment, the removal module comprises a polishing tool for partial removal of the copper overburden. The polishing tool, for example, comprises a CMP or eCMP tool. Other types of removal tools, such as etch tools, are also useful.

Optionally, the first platform further includes a deposition module 434a and an anneal module 436a. The deposition module includes an in-situ deposition tool for forming the passivation layer on the remaining copper overburden. The deposition module can also include a clean tool. The clean tool, for example, is a wet clean tool such as megasonic bath or double brush cleaner. Other types of clean tools are also useful. The clean tool, for example, can be used to prepare substrate surface before and/or after depositing the passivation layer. Additionally, a drying tool, such as SRD or vapor dryer, can be provided in the deposition module to dry the substrate after cleaning. The anneal module includes, for example, a rapid thermal process (RTP) tool for annealing the substrate. Alternatively, the deposition and/or anneal modules 434b and 436b are provided separately from the first tool platform.

The polishing tool of the second tool platform, in one embodiment, comprises a CMP tool with first, second and third platens 462, 464 and 466. The CMP tool can be a non-eCMP or eCMP tool. Providing different platens enables different processes to be performed. In one embodiment, the first platen is used to remove the passivation layer and remaining copper overburden, the second platen is used to remove the barrier layer and the third platen is used to remove the hard mask or dielectric. In an alternative embodiment, the second tool platform further comprises a fourth platen 468 for buffing and passivation. Buffing is the process of smoothing the substrate surface using a low pressure polishing scheme, while passivation coats a layer of benzotriazole (BTA) on the copper to prevent corrosion.

Decoupling the bulk removal of copper to reduce the overburden thickness from other polishing processes used to form interconnects in accordance with the invention produces numerous advantages. Such advantages include increased flexibility and process design throughput and reliability. For example, processing times of the different processes within the tool platforms can be more closely matched, such as having a greater number of lower throughput tool platforms than higher tool platforms. This can increase logistic and tool planning flexibility to provide higher throughput and reduced tool cost. Furthermore, segmenting the high and low throughput processes, timing and slurry chemistries can be selected to reduce corrosion.

Figure 5:
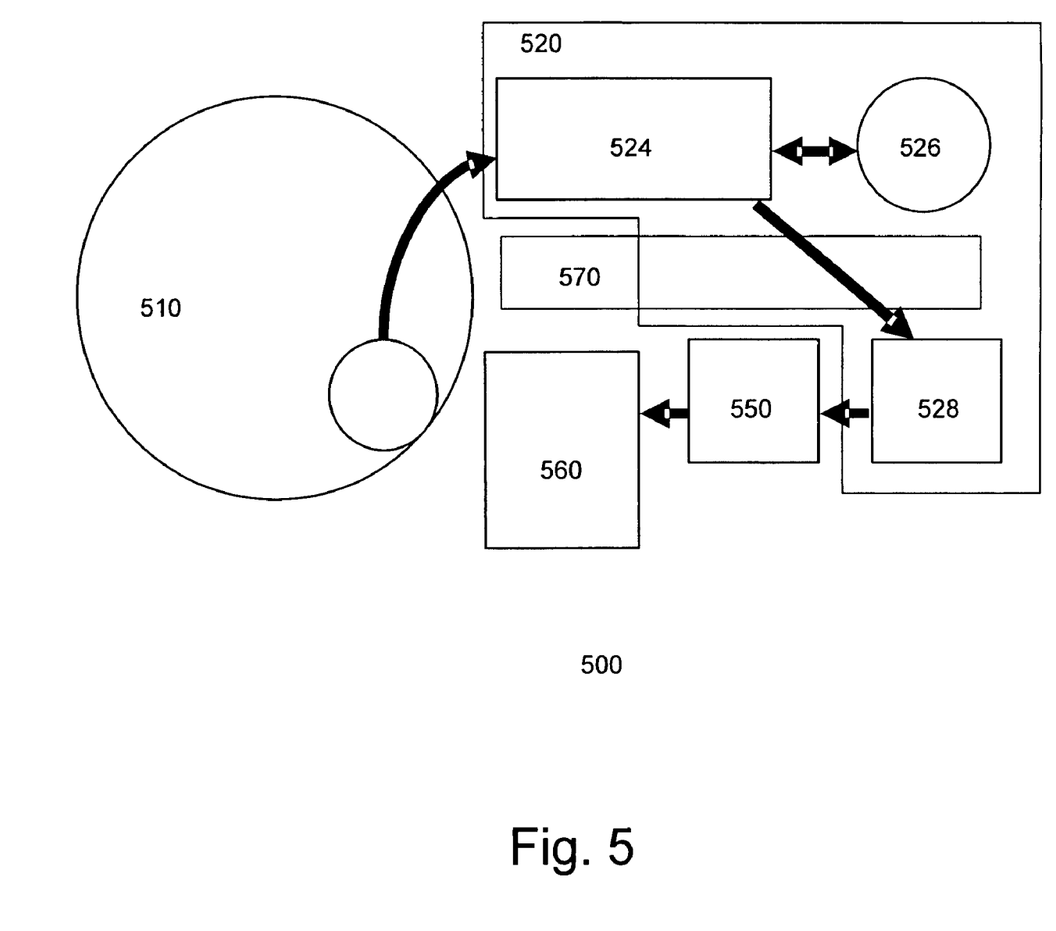
FIG. 5 shows a tool platform in accordance with one embodiment of the invention.

FIG. 5 shows a tool platform 500 in accordance with one embodiment of the invention. The tool platform facilitates reducing the thickness of the overburden. Preferably, the tool platform facilitates reducing the thickness of the overburden and formation of the passivation layer on the remaining overburden. The tool platform comprises a plurality of modules. In one embodiment, the tool platform comprises a polishing module 510, a passivation deposition module 520, an annealing module 550, an internal transport module 570 and external transport module 560. The various modules of the tool platform can be arranged in accordance to the processing sequence within the module. In one embodiment, the modules are arranged in an oval or u-shaped arrangement. Other arrangements are also useful.

The polishing module performs partial removal of the overburden. The polishing module comprises a CMP or eCMP tool. Other types of polishing tools are also useful. The passivation deposition module, in one embodiment, comprises an electroless plating or PVD tool 526. Depending on the requirements, the deposition module can further include cleaning module 524 and a drying module 528. For example, the cleaning module prepares the substrate for the deposition of the passivation layer. Additionally, the cleaning module can prepare the substrate for annealing after deposition of the passivation layer. In one embodiment, the cleaning module comprises a megasonic bath tool and/or double brush cleaner. The drying module dries the substrate either before or after the deposition of the passivation layer, depending on the deposition process used. For example, if electroless plating is used, the substrate is dried after the deposition of the passivation layer. On the other hand, if PVD is used, the substrate is dried before deposition. The drying module comprises a drying tool for drying the substrate after cleaning. The drying tool, for example, can be a vapor dryer or SRD. Other types of cleaning and drying tools are also useful. The annealing module comprises a thermal tool for annealing the substrate.

An external transport tool loads the processed wafer for transport to the next processing station. The internal transport module moves the wafer from one module to the next for processing within the tool platform. Movement, for example, is facilitated by robotic transports. The wafer can go through all or only some of the modules, depending on the processing recipe.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming an IC comprising:
   providing a substrate prepared with a dielectric layer with a trench corresponding to a conductive line;
   depositing a conductive layer on the substrate to fill the trench, wherein the conductive layer includes an overburden to ensure filling of the trench;
   partially reducing a thickness of the overburden of the conductive layer to leave a remaining portion of the overburden having a reduced thickness;
   annealing the substrate after partially reducing the thickness of the overburden, wherein annealing the remaining portion of the overburden with the reduced thickness reduces stress induced defects; and
   after annealing the substrate, removing the remaining portion of the overburden to form the conductive line.

2. The method of claim 1 wherein the conductive layer comprises copper.

3. The method of claim 2 comprises:
   forming a conformal passivation layer on the partially reduced overburden before annealing the substrate, wherein the passivation layer protects the conductive layer from oxidation during annealing; and
   removing the passivation layer after annealing the substrate.

4. The method of claim 3 wherein:
   the dielectric layer includes a hard mask on the surface of the dielectric layer and a barrier layer lining the trench and surface of the hard mask and comprises removing the partially reduced overburden, barrier layer and hard mask; and
   the polishing removes the barrier layer and hard mask over the surface of the dielectric layer to form a top planar surface with the dielectric layer and conductive material of the conductive layer in the trench.

5. The method of claim 4 wherein:
   partially reducing the thickness of the overburden, forming the passivation and annealing are performed in a first tool platform for high throughput processing; and
   removing the passivation layer, partially reduced overburden, barrier layer and hard mask are performed in a second tool platform.

6. The method of claim 5 wherein reducing and removing comprise polishing.

7. The method of claim 3 wherein the passivation layer is formed by electroless plating or physical vapor deposition.

8. The method of claim 3 wherein the passivation layer comprises noble metal or alloy including palladium, platinum, cobalt tungsten or a combination thereof.

9. The method of claim 1 wherein the thickness of the overburden is sufficiently reduced to prevent stress induced defects.

10. The method of claim 9 wherein the thickness of the overburden is reduced to about 500-3000 Å.

11. The method of claim 1 wherein annealing the substrate comprises a temperature sufficient to induce re-crystallization of the conductive material and grain growth.

12. The method of claim 11 wherein annealing the substrate comprises a temperature of greater than 150 to 500° C.

13. The method of claim 1 wherein partially reducing a thickness of the overburden comprises polishing.

14. The method of claim 13 wherein polishing comprises CMP or eCMP.

15. A process for forming a device comprising:
   providing a substrate prepared with a dielectric layer with a trench corresponding to a conductive line;
   depositing a conductive layer on the substrate to fill the trench, wherein the conductive layer includes an overburden to ensure filling of the trench;
   reducing partially a thickness of the overburden to leave a remaining portion of the overburden having a reduced thickness;
   forming a conformal passivation layer on the partially reduced overburden;
   annealing the substrate with the partially reduced overburden and passivation layer, wherein annealing the remaining portion of the overburden with the reduced thickness reduces stress defects;
   removing the passivation layer; and
   removing the remaining portion of the partially reduced overburden to form the conductive line in the trench.

16. The process of claim 15 wherein the conductive layer comprises copper.

17. The process of claim 15 wherein reducing comprises polishing.

18. The process of claim 15 wherein removing comprise polishing.

19. The method of claim 15 wherein the passivation layer is formed by electroless plating or physical vapor deposition.

20. A method for forming a device comprising:
   providing a substrate prepared with a dielectric layer with a trench corresponding to a conductive line;
   depositing a conductive layer on the substrate to fill the trench, wherein the conductive layer includes an overburden to ensure filling of the trench;
   partially reducing a thickness of the overburden of the conductive layer to leave a remaining portion of the overburden having a reduced thickness;
   annealing the substrate with the remaining portion of the overburden to reduce stress defects; and
   after annealing the substrate, removing the remaining portion of the overburden to form the conductive line.

21. The method of claim 20 wherein removing the overburden to form the conductive line comprises polishing.

22. The method of claim 21 wherein polishing comprises CMP, eCMP or a combination thereof.

23. The method of claim 20 wherein partially reducing a thickness of the overburden comprises polishing.

24. The method of claim 23 wherein polishing comprises CMP, eCMP or a combination thereof.

25. The method of claim 20 wherein:
   partially reducing a thickness of the overburden comprises polishing; and
   removing the overburden to form the conductive line comprises polishing.

26. The method of claim 25 wherein partially reducing the overburden and removing the overburden are performed on different polishing platens.

27. The method of claim 25 wherein polishing comprises CMP, eCMP or a combination thereof.

28. The method of claim 27 wherein partially reducing the overburden and removing the overburden are performed on different polishing platens.

29. The method of claim 20 wherein annealing the partially reduced overburden reduces stress related defects in vias in communication with the trench.

30. The method of claim 29 wherein annealing recyrstallizes the conductive layer.

31. The method of claim 20 comprises forming a passivation layer on the overburden with reduced thickness to protect the conductive layer from oxidation.

32. The method of claim 31 wherein the passivation layer comprises a conformal passivation layer.

33. The method of claim 32 wherein the passivation layer comprises an inert metal.

34. The method of claim 32 wherein the passivation layer can be removed at about 2-3 times faster than the conductive layer.

35. The method of claim 31 wherein the passivation layer comprises an inert metal.

36. The method of claim 31 wherein the passivation layer can be removed at about 2-3 times faster than the conductive layer.

37. The method of claim 20 wherein the conductive layer comprises copper.

* * * * *